(12) United States Patent
Chew

(10) Patent No.: US 11,428,723 B2
(45) Date of Patent: Aug. 30, 2022

(54) METHOD AND SYSTEM FOR EMULATING AN ELECTROMAGNETIC ENVIRONMENT IN AN ANECHOIC CHAMBER

(71) Applicant: Rohde & Schwarz GmbH & Co. KG, Munich (DE)

(72) Inventor: Sam Chew, Singapore (SG)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 240 days.

(21) Appl. No.: 16/740,038

(22) Filed: Jan. 10, 2020

(65) Prior Publication Data

US 2021/0096165 A1    Apr. 1, 2021

(30) Foreign Application Priority Data

Sep. 30, 2019 (EP) .................................... 19200490

(51) Int. Cl.
  *G01R 29/08* (2006.01)
  *H04B 17/00* (2015.01)
  *G01R 1/28* (2006.01)

(52) U.S. Cl.
  CPC ..... *G01R 29/0821* (2013.01); *H04B 17/0085* (2013.01)

(58) Field of Classification Search
  CPC ... G01R 29/0821; G01R 1/28; H04B 17/0085
  See application file for complete search history.

(56) References Cited

U.S. PATENT DOCUMENTS

| | | | | |
|---|---|---|---|---|
| 2013/0052962 A1* | 2/2013 | Hansen | ............... | G01R 29/0871 455/67.12 |
| 2013/0099985 A1* | 4/2013 | Gross | ..................... | H04B 17/21 343/703 |
| 2014/0087668 A1* | 3/2014 | Mow | ...................... | H04W 24/08 455/67.14 |
| 2014/0141727 A1* | 5/2014 | Kildal | .................. | G01R 29/105 455/67.12 |
| 2017/0093509 A1* | 3/2017 | Kyosti | .................. | H04W 24/06 |
| 2018/0306904 A1 | 10/2018 | Vacanti | | |
| 2019/0052376 A1* | 2/2019 | Chervyakov | ........ | H04B 17/318 |

* cited by examiner

*Primary Examiner* — Jermele M Hollington
*Assistant Examiner* — Temilade S Rhodes-Vivour
(74) *Attorney, Agent, or Firm* — Ditthavong, Steiner & Mlotkowski

(57) ABSTRACT

A method for emulating an electromagnetic environment, EME, in an anechoic chamber comprises the steps of: receiving, by a first receiving unit, an input signal outside the anechoic chamber; generating, by a signal generating unit, an emulated signal based on the input signal; transmitting, by a transmitting unit, the emulated signal inside the anechoic chamber to emulate the EME; receiving, by a second receiving unit, the emulated signal inside the anechoic chamber; and adjusting, by the signal generating unit, the emulated signal generated by the signal generating unit based on the emulated signal received by the second receiving unit.

13 Claims, 5 Drawing Sheets

METHOD AND SYSTEM FOR EMULATING AN ELECTROMAGNETIC ENVIRONMENT IN AN ANECHOIC CHAMBER

The present application claims priority to European Patent Application No. 19 200 490.1, filed on Sep. 30, 2019, which is incorporated herein by its entirety.

The invention relates to electromagnetic compatibility (EMC) and to testing of devices by means of radio frequency (RF) signals or electromagnetic radiation. In particular, the invention provides a controlled electromagnetic environment for such tests. More specifically, the present invention relates to emulating an electromagnetic environment in an anechoic chamber.

In a conventional solution, a device under test (DUT) is tested for EMC. Typically, the DUT is exposed to an electromagnetic signal in an anechoic chamber. The electromagnetic signal is artificially created by a signal generator and e.g. may have a very high field strength. However, it is desired to test a DUT in more complex scenarios, which is why the signals which are artificially created by the signal generator are no longer sufficient. It is in particular desired to test the DUT in an electromagnetic environment (EME) which corresponds to a real world environment of the intended use case of the DUT.

US 2018/0306904 A1 for example discloses a system for testing integrated radar systems. However, this solution fails to provide a complex electromagnetic signal which is required for effective EMC testing, as outlined above.

Therefore, the object of the invention is to provide a method for testing devices which can emulate a real word EME in an anechoic chamber. Moreover, the object is to provide an according system and computer program.

The object is solved by the features of the first independent claim for the method and by the features of the second independent claim for the system. Further, it is solved by the features of an associated computer program product. The dependent claims contain further developments.

An inventive method for emulating an electromagnetic environment, EME, in an anechoic chamber comprises the steps of: receiving, by a first receiving unit, an input signal outside the anechoic chamber; generating, by a signal generating unit, an emulated signal based on the input signal; transmitting, by a transmitting unit, the emulated signal inside the anechoic chamber to emulate the EME; and adjusting, by the signal generating unit, the emulated signal generated by the signal generating unit based on the emulated signal transmitted by the transmitting unit.

This is beneficial, as e.g. a RF baseband signal (which may comprise an in-phase component and a quadrature component) can be captured and recorded (i.e. the input signal of the method). Based on the recorded signal, a test system can be calibrated for tests using broadband interferences signals of different bandwidth. Such a test system which can control and automate tests based on the recorded signal may e.g. comprise a RF vector generator, an in-phase component and a quadrature component baseband recorder, a RF Spectrum analyzer, a RF switching unit, a turntable, antenna mast and RF power amplifier. The recorded signal can be managed, e.g. with regards to center frequency, sampling rate, reference level and recording time. The invention also allows for saving and extracting a waveform file based on the input signal, transferring waveform files and playing back a real signal from a signal generator based in the waveform file. Further, a EME waveform playback similarity signature evaluation can be performed with the recorded trace (i.e. the input signal). Also, a frequency response adjustment can be performed to meet a desired field strength for testing in the test system.

That is, the method according to the present invention allows for emulating EME signal influence of a real-world scenario in an anechoic chamber systematically, objectively and safely.

As characteristics of real-world EME interference signals comprise narrowband or/and broadband signals along the time variation, the present invention ensures that these complex signals can be reproduced in an anechoic chamber via a transmitting unit with high similarity with the recorded signal of a defined bandwidth from the environment (i.e. the input signal to the method).

In particular, the adjusting, by the signal generating unit, the emulated signal generated by the signal generating unit based on the emulated signal transmitted by the transmitting unit allows for calibrating a test system to produce a test signal with a desired field strength and in order to ensure repeatability of the test. This also ensures safe operation of a test system, especially when signals of high field strength are generated. This is also beneficial, as a waveform playback similarity signature can be evaluated, to further adapt the emulated EME to a real world scenario recorded outside the anechoic chamber. Also, RF signal adjustment (of the signal that emulates the EME in the anechoic chamber) can be performed in order to reproduce the same waveform and achieve similar interference effects as in the recorded real world scenario.

In particular, emulating (that is, generating the emulated signal) includes generating an emulated signal by means of a signal generator, wherein the emulated signal corresponds to the input signal. Thereby, the input signal (which e.g. was recorded outside the anechoic chamber) is reproduced inside the anechoic chamber. The emulated signal thereby compensates for effects which arise due to the characteristics of the anechoic chamber, e.g. interference effects. That is, the emulated signal that is transmitted inside the anechoic chamber creates the same EME as it is present outside the anechoic chamber (represented by the input signal).

In particular, the input signal represents an EME that is present outside the anechoic chamber. In particular, the EME outside the anechoic chamber is present at a predefined spot where the input signal is received.

In particular, the input signal comprises an electromagnetic signal and/or an electromagnetic waveform. In particular, the input signal comprises a narrowband, a baseband and/or a wideband signal. In particular, the input signal comprises broadcast transmission, radar radiation, an out-of-band signal, environmental noise and/or influence from other transmitters. In particular, the input signal comprises a radio frequency baseband signal. In particular, the radio frequency baseband signal comprises an in-phase and/or a quadrature component.

In particular, the emulated signal comprises an electromagnetic signal and/or an electromagnetic waveform. In particular, the emulated signal comprises a narrowband, a baseband and/or a wideband signal. In particular, the emulated signal comprises broadcast transmission, radar radiation, an out-of-band signal, environmental noise and/or influence from other transmitters. In particular, the emulated signal comprises a radio frequency baseband signal. In particular, the radio frequency baseband signal comprises an in-phase and/or a quadrature component.

In particular, a device under test, DUT, can be placed inside the anechoic chamber.

In particular, the anechoic chamber is a room designed to completely absorb reflections of electromagnetic waves. In particular, anechoic means non-reflective, non-echoing and/or echo-free.

In particular, receiving the input signal by the first receiving unit comprises recording the input signal (e.g. by the first receiving unit or by the signal generating unit). The recorded signal can be of arbitrary length. In particular, the method further includes generating, by the signal generating unit, the emulated signal based on the recorded input signal.

In particular, the signal generating unit includes a signal amplification unit.

In particular, the adjusting of the emulated signal comprises applying a fast Fourier transformation, FFT, to the input signal and/or the emulated signal.

In particular, the transmitting unit comprises a transmitting circuit, and/or an antenna. In particular, the first receiving unit comprises a first receiving circuit, and/or an antenna. In particular, the second receiving unit comprises a second receiving circuit, and/or an antenna.

Advantageously and preferably, the method further comprises the steps of receiving, by a second receiving unit, the emulated signal inside the anechoic chamber; and adjusting, by the signal generating unit, the emulated signal generated by the signal generating unit based on the emulated signal received by the second receiving unit.

In particular, the second receiving unit includes a receiving antenna.

Advantageously and preferably, the method further comprises the steps of analyzing, by a spectrum analyzer, the emulated signal received by the second receiving unit to obtain an analyzing result, and adjusting, by the signal generating unit, the emulated signal generated by the signal generating unit based on the analyzing result.

Advantageously and preferably, the method further comprises the step of performing frequency response correction based on the input signal and/or the emulated signal and/or the analyzing result, to adjust the emulated signal.

In particular, the frequency response correction is based on an SMW-K544 algorithm, or on a similar algorithm.

In particular, the frequency response correction is performed in the signal generating unit and/or in the spectrum analyzer. In particular, the frequency response correction is performed in the signal generating unit and/or in the spectrum analyzer by means of test software.

Advantageously and preferably, the input signal comprises a signal in the range from 100 kHz to 60 GHz, preferably in the range from 80 MHz to 1 GHz.

Advantageously and preferably, the method further comprises the step of performing a waveform similarity test based on the input signal; and based on the emulated signal generated by the signal generating unit and/or based on the emulated signal received by the second receiving unit and/or based on the analyzing result.

In particular, the waveform similarity test includes converting at least one of the above signals or the result to a frequency domain for correction and magnitude adjustment.

In particular, the waveform similarity test is performed in the signal generating unit and/or in the spectrum analyzer.

In particular, the method further includes the step of determining a performance of EME emulation, based on a result of the waveform similarity test.

In particular, the performance is determined in the signal generating unit and/or in the spectrum analyzer.

Advantageously and preferably, the first receiving unit is attached to a mobile unit, and the method further comprises the step of receiving the input signal during a test drive of the mobile unit.

In particular, the mobile unit can be a car, a truck, a plane, a helicopter, a drone, a boat, a pedestrian, or the like. In particular, the mobile unit can be driven by a human, and/or can be driven autonomous.

Advantageously and preferably, the input signal and/or the emulated signal comprises a fading component.

An inventive system for emulating an electromagnetic environment, EME, in an anechoic chamber comprises: a first receiving unit configured to receive an input signal outside the anechoic chamber; a signal generating unit configured to generate an emulated signal based on the input signal; a transmitting unit configured to transmit the emulated signal inside the anechoic chamber to emulate the EME; wherein the signal generating unit is further configured to adjust the emulated signal generated by the signal generating unit based on the emulated signal transmitted by the transmitting unit.

Advantageously and preferably, the system is configured to receive, by a second receiving unit of the system, the emulated signal inside the anechoic chamber; and to adjust, by the signal generating unit, the emulated signal generated by the signal generating unit based on the emulated signal received by the second receiving unit.

In particular, the second receiving unit includes a receiving antenna.

Advantageously and preferably, the system further comprises a spectrum analyzer configured to analyze the emulated signal received by the second receiving unit to obtain an analyzing result, wherein the signal generating unit is further configured to adjust the emulated signal generated by the signal generating unit based on the analyzing result.

Advantageously and preferably, the system is further configured to perform frequency response correction based on the input signal and/or the emulated signal and/or the analyzing result, to adjust the emulated signal.

In particular, the frequency response correction is performed in the signal generating unit and/or in the spectrum analyzer. In particular, the frequency response correction is performed in the signal generating unit and/or in the spectrum analyzer by means of test software.

Advantageously and preferably, the input signal comprises a signal in the range from 100 kHz to 60 GHz, preferably in the range from 80 MHz to 1 GHz.

Advantageously and preferably, the system is further configured to perform a waveform similarity test based on the input signal; and based on the emulated signal generated by the signal generating unit and/or based on the emulated signal received by the second receiving unit and/or based on the analyzing result.

In particular, the waveform similarity test is performed in the signal generating unit and/or in the spectrum analyzer.

In particular, the method further includes the step of determining a performance of EME emulation, based on a result of the waveform similarity test.

In particular, the performance is determined in the signal generating unit and/or in the spectrum analyzer.

Advantageously and preferably, the first receiving unit is attached to a mobile unit of the system, and the system is further configured to receive the input signal during a test drive of the mobile unit.

The inventive system comprises the same advantages as the inventive method.

An inventive computer program product comprises program code for performing steps of the above described inventive method, when the computer program product runs on a computer or a digital signal processor.

The inventive computer program product comprises the same advantages as the inventive device.

An exemplary embodiment of the invention is now further explained with respect to the drawings by way of examples only, in which FIG. 1 shows a schematic view of a method according to an embodiment of the present invention;

Figure 3:
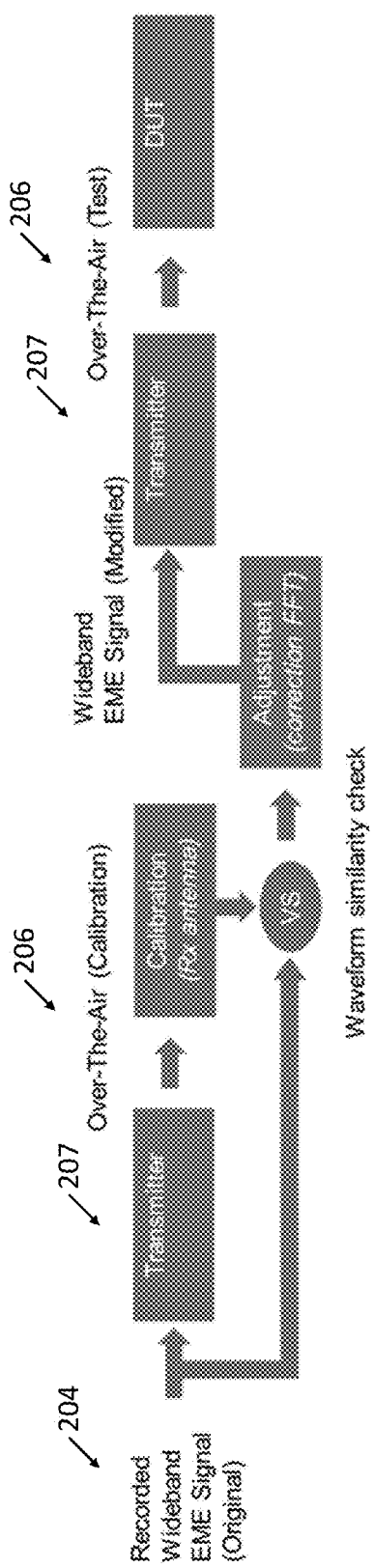
FIG. 3 shows a schematic view of an operating scenario according to the present invention.
Figure 4:
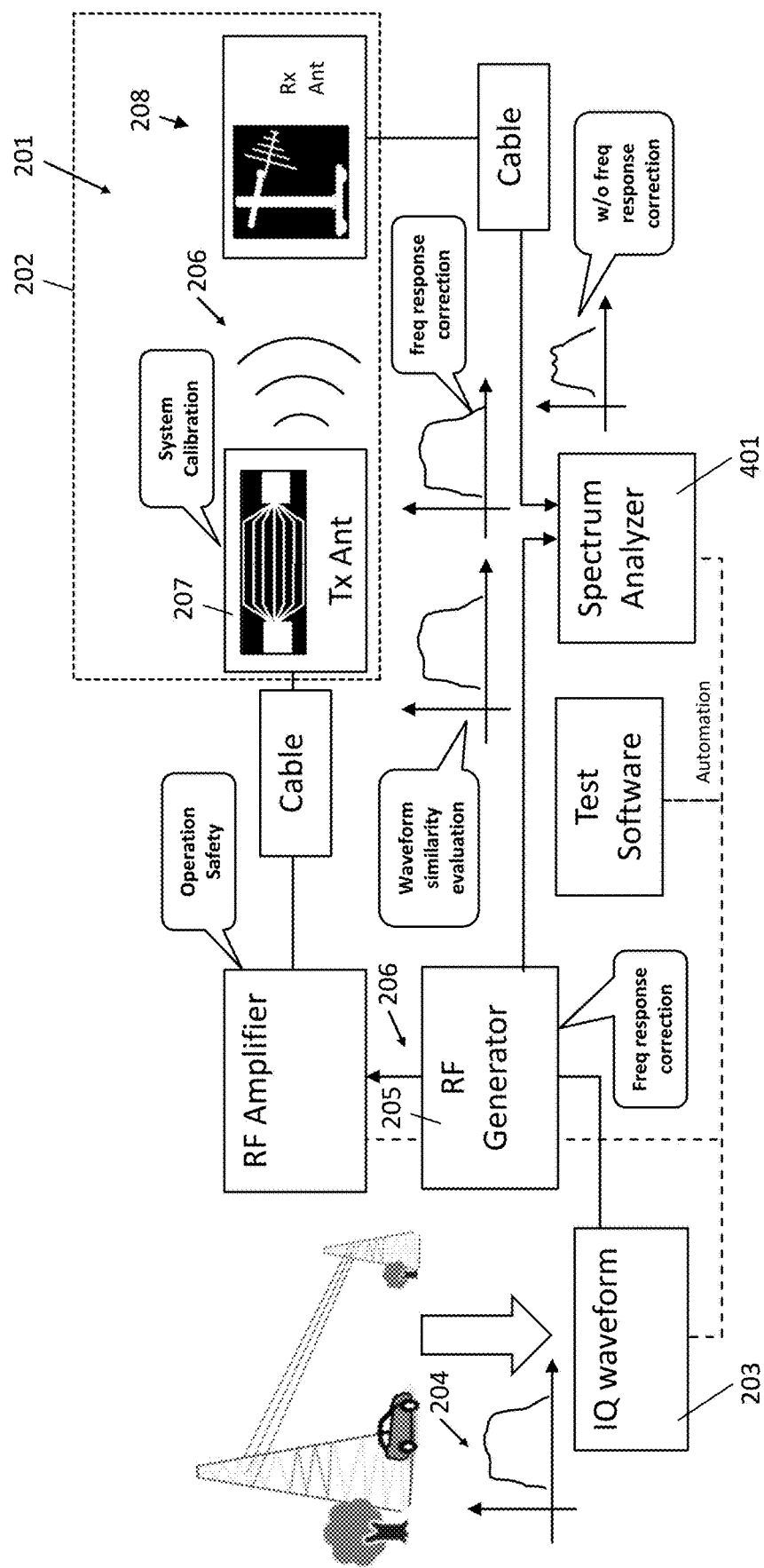
FIG. 4 shows another schematic view of an operating scenario according to the present invention.
Figure 5:
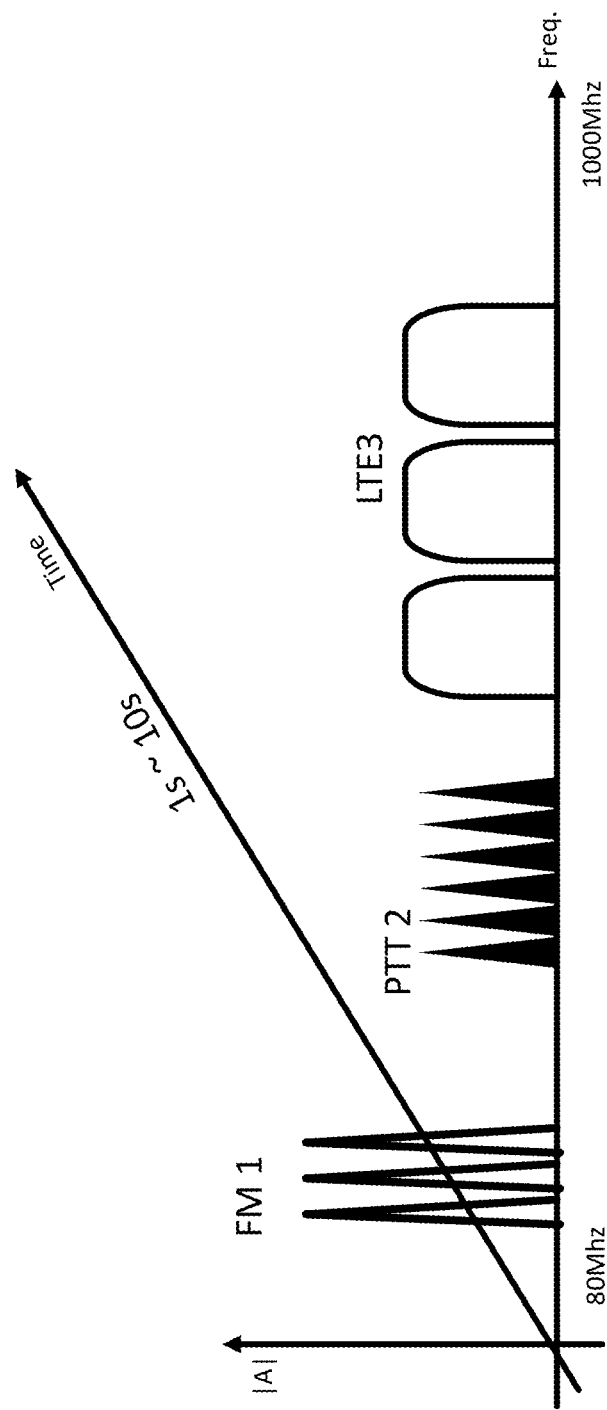
FIG. 5 shows a schematic view of signals processed by the present invention.

In the following, the function of an embodiment of the inventive method is described based on FIG. 1. Then, based on FIG. 2, structure and function of an embodiment of the inventive system are going to be described. In FIG. 3 and FIG. 4, operating scenarios according to the present invention are described. FIG. 5 shows an illustrative view of a signal that can be used by the present invention, either as an input signal, or as an emulated signal to emulate the EME in the anechoic chamber.

Figure 1:
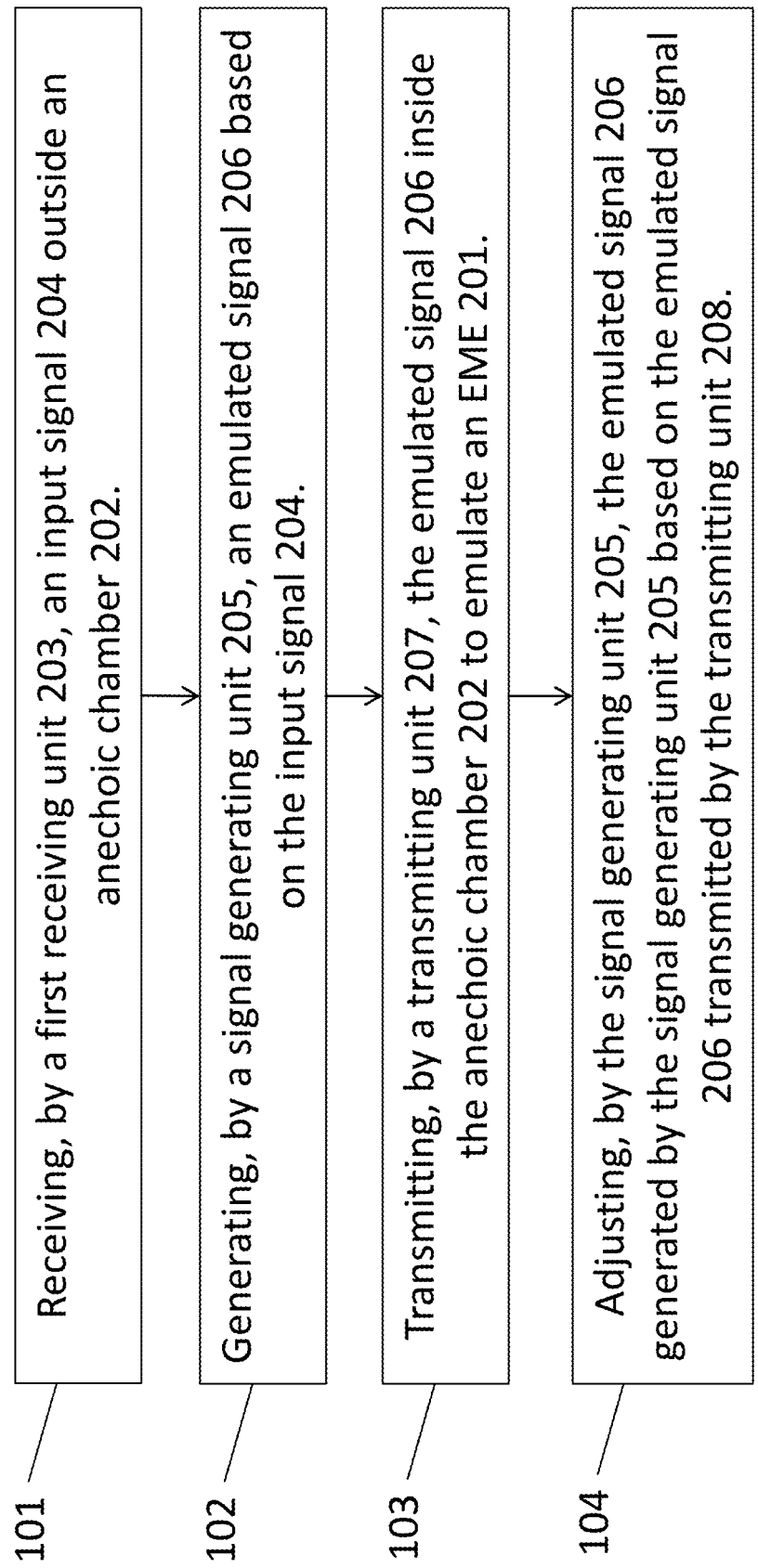

FIG. 1 shows a method 100 for emulating an electromagnetic environment 201 in an anechoic chamber 202. As illustrated in FIG. 1, the method 100 comprises the steps of: receiving 101, by a first receiving unit 203, an input signal 204 outside the anechoic chamber 202; generating 102, by a signal generating unit 205, an emulated signal 206 based on the input signal 204; transmitting 103, by a transmitting unit 207, the emulated signal 206 inside the anechoic chamber 202 to emulate the EME 201; and adjusting 104, by the signal generating unit 205, the emulated signal 206 generated by the signal generating unit 205 based on the emulated signal 206 transmitted by the transmitting unit 207.

In a step, which is optional and therefore not shown in FIG. 1, the emulated signal 206 can be received by a second receiving unit 208 inside the anechoic chamber 202. The emulated signal 206 generated by the signal generating unit 205 is then adjusted based on the emulated signal 206 received by the second receiving unit 208.

In another step, which is optional and therefore not shown in FIG. 1, the emulated signal 206 that is received by the second receiving unit 208 is analyzed by a spectrum analyzer 401 to obtain an analyzing result. The emulated signal 206 generated by the signal generating unit 205 is then also adjusted based on the analyzing result.

Figure 2:
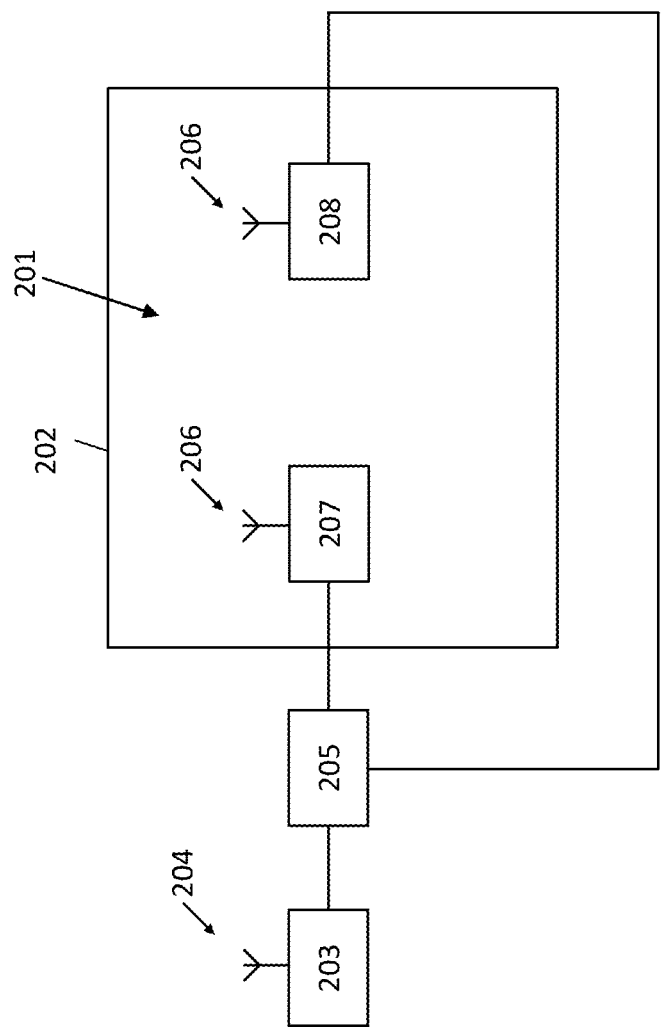
FIG. 2 shows a schematic view of a system according to an embodiment of the present invention.

FIG. 2 shows a system 200 according to an embodiment of the present invention. The system 200 is for emulating an electromagnetic environment, 201 in an anechoic chamber 202.

To this end, the system 200 comprises a first receiving unit 203, which is configured to receive an input signal 204 outside the anechoic chamber 202. The system 200 further comprises a signal generating unit 205 configured to generate an emulated signal 206 based on the input signal 204. The signal generating unit 205 may optionally also include an amplifier for amplifying the emulated signal 206 before transmitting it. The system 200 also comprises a transmitting unit 207 configured to transmit the emulated signal 206 inside the anechoic chamber 202. By transmitting the emulated signal 206, which corresponds to the obtained (and possibly recorded) input signal, inside the anechoic chamber, the EME 201 is emulated.

The signal generating unit 205 is further configured to adjust the emulated signal 206 generated by the signal generating unit 205 based on the emulated signal 206 transmitted by the transmitting unit 207. This provides a feedback loop, according to which the emulated signal 206 can be calibrated to provide a desired field strength, and desired interference signals of different bandwidth, as this is also the case in a real world scenario outside the anechoic chamber, which is going to be emulated inside the anechoic chamber by the system 200.

FIG. 2 also shows a second receiving unit 208 of the system 200, which is an optional part of the system 200. The emulated signal 206 is received by the second receiving unit 208 inside the anechoic chamber 202. The second receiving unit e.g. can include an antenna. Then the emulated signal 206 generated by the signal generating unit 205 is adjusted based on the emulated signal 206 received by the second receiving unit 208.

The system 200 further can comprise an optional spectrum analyzer, which is not shown in FIG. 2. The spectrum analyzer can analyze the emulated signal 206 received by the second receiving unit 208 to obtain an analyzing result. The emulated signal 206 generated by the signal generating unit 205 is then adjusted also based on the analyzing result.

FIG. 3 shows a schematic view of an operating scenario according to the present invention. FIG. 3 is however just for illustrating the operating principle and therefore does not show all features which are e.g. described in view of FIG. 1 or FIG. 2. The process shown in FIG. 3 is in particular shown over time, which is why several entities are shown twice.

As shown in FIG. 3, an input signal 204 is received outside an anechoic chamber 202. An emulated signal 206 is generated based on the input signal 204 and then transmitted by means of a transmitting unit 207. Based on the input signal 204 and based on the emulated signal 206, further calibration and adjustment of the emulated signal 206 can be performed, and the adjusted emulated signal 206 is again output by the transmitting unit 207. The emulated signal 206 is applied to a DUT, as shown in FIG. 3.

FIG. 4 shows a schematic view of another operating scenario according to the present invention. FIG. 4 is however just for illustrating the operating principle and therefore does not show all features which are e.g. described in view of FIG. 1 or FIG. 2.

As shown in FIG. 4, an input signal 204 is received by a first receiving unit 203. An emulated signal 206 is then generated by a signal generating unit 205, based on the input signal 204. Although it is shown as a separate entity in FIG. 4, the signal generating unit 205 may also include an amplifier for amplifying the emulated signal 206. The emulated signal 206 is then provided to a transmitting unit 207, where the emulated signal 206 is transmitted inside the anechoic chamber 202. In the anechoic chamber 202, the emulated signal 206 is received by means of a second receiving unit 208. The received emulated signal 206 is provided to a spectrum analyzer 401, which analyzes the received emulated signal 206 and provides and analyzation result. Further test software can be applied to the received emulated signal 206, and/or the analyzing result, such as software implementing frequency response correction and/or a waveform similarity test. The received emulated signal 206 and/or the analyzing result are then provided to the signal generating unit 205, where the emulated signal 206 which is provided by the signal generating unit 205 is adjusted based on the received emulated signal 206, and/or based on the analyzing result.

FIG. 5 shows a schematic view of signals processed by the present invention. The shown signals can be included in the input signal 204, and/or in the emulated signal 206. The signals shown in FIG. 5 include frequency modulated signals FM1 in the typical spectrum of radio broadcast communication. The signals shown in FIG. 5 include signals PTT2 in the typical spectrum of push-to-talk handheld radios. The signals shown in FIG. 5 include signals LTE3 in the typical spectrum of LTE user equipments UEs, or base stations. That is, the input signal 204 and/or the emulated signal 206 can include at least one component in the range from 100 kHz to 60 GHz, preferably in the range from 80 MHz to 1 GHz. In particular, the signal 204 and/or the emulated signal 206 additionally or alternatively can also include at least one component from 5G Frequency Range 2 (FR2), which includes frequency bands from 24.25 GHz to 52.6 GHz.

It is important to note that the inventive system and method very closely correspond. Therefore, all of the above said regarding the system is also applicable to the method and vice versa. Everything which is described in the description and/or claimed in the claims and/or drawn in the drawings can be combined.

The invention is not limited to the illustrated embodiment. All features described above or features shown in the figures can be combined with each other in any advantageous manner within the scope of the invention.

What is claimed is:

1. A method for emulating an electromagnetic environment, EME, in an anechoic chamber, the method comprising the steps of:
    receiving, by a first receiving unit, an input signal outside the anechoic chamber;
    generating, by a signal generating unit, an emulated signal based on the input signal;
    transmitting, by a transmitting unit, the emulated signal inside the anechoic chamber to emulate the EME, wherein the transmitting unit comprises a transmitting antenna inside the anechoic chamber;
    receiving, by a second receiving unit, the emulated signal inside the anechoic chamber, wherein the second receiving unit comprises a receiving antenna inside the anechoic chamber; and
    adjusting, by the signal generating unit, the emulated signal generated by the signal generating unit based on the emulated signal transmitted by the transmitting unit and received by the second receiving unit.

2. The method according to claim 1, further comprising the steps of analyzing, by a spectrum analyzer, the emulated signal received by the second receiving unit to obtain an analyzing result, and adjusting, by the signal generating unit, the emulated signal generated by the signal generating unit based on the analyzing result.

3. The method according to claim 2, further comprising the step of performing frequency response correction based on the input signal and/or the emulated signal and/or the analyzing result, to adjust the emulated signal.

4. The method according to claim 3, wherein the input signal and/or the emulated signal comprises a signal in the range from 100 kHz to 60 GHz, preferably in the range from 80 MHz to 1 GHz.

5. The method according to claim 4, further comprising the step of performing a waveform similarity test based on the input signal; and based on the emulated signal generated by the signal generating unit and/or based on the emulated signal received by the second receiving unit and/or based on the analyzing result.

6. The method according to claim 5, wherein the first receiving unit is attached to a mobile unit, and wherein the method further comprises the step of receiving the input signal during a test drive of the mobile unit.

7. The method according to claim 6, wherein the input signal and/or the emulated signal comprises a fading component.

8. A system for emulating an electromagnetic environment, EME, in an anechoic chamber, wherein the system comprises:
    a first receiving unit configured to receive an input signal outside the anechoic chamber;
    a signal generating unit configured to generate an emulated signal based on the input signal;
    a transmitting unit configured to transmit the emulated signal inside the anechoic chamber to emulate the EME, wherein the transmitting unit comprises a transmitting antenna inside the anechoic chamber; and
    a second receiving unit configured to receive the emulated signal inside the anechoic chamber, wherein the second receiving unit comprises a receiving antenna inside the anechoic chamber,
    wherein the signal generating unit is further configured to adjust the emulated signal generated by the signal generating unit based on the emulated signal transmitted by the transmitting unit and received by the second receiving unit.

9. The system according to claim 8, further comprising a spectrum analyzer configured to analyze the emulated signal received by the second receiving unit to obtain an analyzing result, wherein the signal generating unit is further configured to adjust the emulated signal generated by the signal generating unit based on the analyzing result.

10. The system according to claim 9, further configured to perform frequency response correction based on the input signal and/or the emulated signal and/or the analyzing result, to adjust the emulated signal.

11. The system according to claim 10, wherein the input signal and/or the emulated signal comprises a signal in the range from 100 kHz to 60 GHz, preferably in the range from 80 MHz to 1 GHz.

12. The system according to claim 11, further configured to perform a waveform similarity test based on the input signal; and based on the emulated signal generated by the signal generating unit and/or based on the emulated signal received by the second receiving unit and/or based on the analyzing result.

13. The system according to claim 12, wherein the first receiving unit is attached to a mobile unit of the system, and wherein the system is further configured to receive the input signal during a test drive of the mobile unit.

* * * * *